United States Patent [19]

Woodward

[11] 4,399,316

[45] Aug. 16, 1983

[54] NON-CONTACTING RF SHIELDING DEVICE

[75] Inventor: Oakley M. Woodward, Princeton, N.J.

[73] Assignee: RCA Corporation, New York, N.Y.

[21] Appl. No.: 279,181

[22] Filed: Jun. 30, 1981

[51] Int. Cl.³ .............................................. H05K 9/00
[52] U.S. Cl. ................................ 174/35 GC; 361/424
[58] Field of Search .......... 174/35 R, 35 GC, 35 MS; 361/424; 455/300, 301; 219/10.55 D; 334/85

[56] References Cited

U.S. PATENT DOCUMENTS

| | | | |
|---|---|---|---|
| 2,317,813 | 4/1943 | Schoenborn | 174/35 |
| 2,604,507 | 7/1952 | Tyson | 174/35 |
| 2,825,042 | 2/1958 | Tollefson et al. | 174/35 GC X |
| 4,347,420 | 8/1982 | Ikeda et al. | 174/35 GC X |

*Primary Examiner*—A. T. Grimley
*Assistant Examiner*—D. A. Tone

*Attorney, Agent, or Firm*—E. M. Whitacre; J. S. Tripoli; W. H. Meise

[57] ABSTRACT

A non-contacting RF shielding means is provided to inhibit the flow of energy in a given frequency band through an interface area between two conductive surfaces. A series of stub-like members are provided which are open circuited at one end and connected to a common conductive member on the other end. A portion of the first conductive surface is spaced from the stubs such that a plurality of microstrip lines are formed. The open circuits at the one end of the stubs reflect back as low impedance paths between the first surface and the other end of each of the stubs. The common conductive member is coupled to the second conductive surface. The arrangement thus provides a plurality of low impedance paths between the first and second conductive surfaces in the given frequency band without direct physical contact between the two conductive surfaces.

6 Claims, 8 Drawing Figures

NON-CONTACTING RF SHIELDING DEVICE

The present invention relates generally to RF shielding apparatus and more particularly to a device for providing improved shielding at the junction between two conductive surfaces without direct electrical contact therebetween.

There are many applications where it is desirable to provide RF shielding either to prevent RF radiation from leaking out, or, by the principle of reciprocity, to prevent interference from extraneous RF radiation. Examples of such applications are radio receivers, microwave ovens, X-ray equipment and certain types of video disc players. In describing the preferred embodiment for practicing the present invention, a video disc player will be used as the example, but, it will be understood that the principles and advantages of the present invention will be applicable to a number of other devices.

In the pickup cicuitry for certain capacitive type video disc systems, such as described in U.S. Pat. No. 3,842,194 issued to Clemens, an oscillator is used to drive a tuned circuit, one component of which is the variable capacitance formed between an electrode on a stylus and a conductive property of the playback disc. This oscillator provides a signal at 915 MHz. An example of such pickup circuitry may be found with reference to U.S. Pat. No. 4,080,625 issued to Kawamoto. In the United States this frequency is within the ISM (Industrial, Scientific, Medical) band which has been designated for such equipment. There are standards set for the amount of RF radiation allowed from such equipment to insure that other devices in the area do not experience interference from RF signals generated in the given equipment.

In other countries of the world, notably in Europe, designated frequency bands for certain classes of equipment may not exist. Therefore, to cope with potential RF interference, these countries simply set very stringent requirements for the maximum allowable RF radiation from devices such as video disc players. Thus the problem arises as to the manner in which these stringent requirements can be met.

It is well known in the art that RF radiation may be substantially reduced by enclosing equipment with the potential for radiation (or, by reciprocity, the susceptibility to RF interference) in a conductive enclosure. In the case of a video disc player this may be accomplished by providing an inner metal box surrounded by a decorative outer shell, or, by coating the inside surfaces of the decorative shell with a conductive material.

Despite such an approach, a problem still exists in trying to meet stringent RF radiation standards. The video disc player shell is typically manufactured in two parts, an upper part and a lower part. In addition, a cover or lid is provided in the upper part to provide access to a carriage which houses a replaceable stylus cartridge. It has been found that even with the use of inner metal boxes or conductive inner surfaces, RF leakage still occurs at the seam separating the upper and lower parts as well as the seam around the cartridge access cover in the upper part.

It is known in the art that leakage (or susceptibility) at such seams can be reduced by providing direct electrically conductive contact between the two conductive surfaces. Typically, this can be achieved through the use of conductive fingers which are often spring loaded to provide good electrical contact. An example of such an arrangement may be found in U.S. Pat. No. 2,317,813 issued to Schoenborn. Another approach toward sealing off RF radiation at seams may be found in U.S. Pat. No. 2,604,507 issued to Tyson where a metal gasket having pointed edges is used at a seam. In both cases, a reasonable amount of force must be used on the surfaces to be RF shielded to be sure that good electrical contact is obtained.

The problem with such arrangements is that they are costly, they often involve dissimilar metals which can lead to corrosion and the force required to give good contact often results in deformation of the apparatus providing the RF seal. Spring fingers may be bent and metal gaskets may lose their desired shape after repeated assembly and disassembly of the equipment. In addition, consumer access to inner conductive surfaces represents a potential shock hazard.

In accordance with the present invention, the problem of reducing RF energy flow at the interface area of two conductive surfaces is accomplished without a direct electrical contact therebetween. The apparatus for accomplishing this result comprises a plurality of elongated conductive stub-like members located in the interface area. One end of each of the stubs is connected to a common conductive member. The other end of each stub forms an open circuit. A means is provided for spacing at least a portion of one of the conductive surfaces in parallel relationship to the stubs. The stubs and the portion of one of the conductive surfaces form a plurality of microstrip lines. The stubs are dimensioned such that the open circuits are transformed or reflected back at the other end of the stub as a low impedance path in the frequency range of interest. The low impedance paths are then formed between the stubs and the portion of one of the conductive surfaces. A means is provided for coupling the common conductive member to the other conductive surface. In this manner a plurality of low impedance paths, in the frequency range of interest, are formed in the interface area between the two conductive surfaces.

Figure 1:
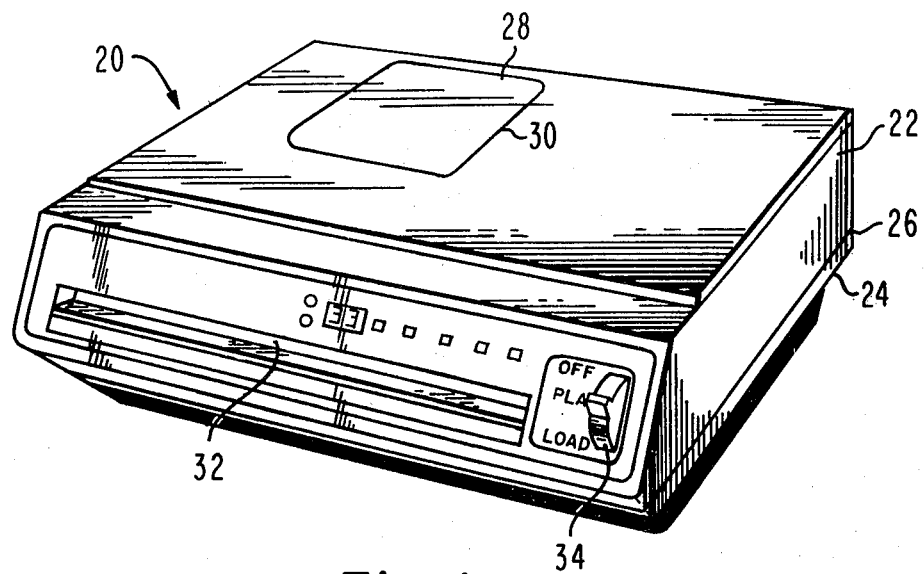
FIG. 1 is a perspective view of a video disc player which utilizes the apparatus of the present invention.

Referring now to FIG. 1, video disc player 20 comprises an upper portion 22 and a lower portion 24. The inner surfaces of both the upper and lower portions of the player can be sprayed with an acrylic paint having metal particles so as to create a substantially enclosed conductive housing for the player electronics which includes an oscillator providing a signal at 915 MHz. The upper and lower portions 22 and 24 are joined at the seam 26 which goes all the way around the player. In the alternative, there can be a conductive box inside of the decorative shell of player 20 which would have corresponding seams and openings.

Also shown in FIG. 1 is the cartridge access cover or lid 28. When cover 28 is raised or removed, a carriage is exposed which carries the replaceable stylus cartridge. In a player where there is concern about RF radiation, the cover 28 has at least its inner surface made conductive as by the use of conductive paint or, in the alternative there would be a corresponding cover in the enclosed conductive box. The seam 30 represents the interface between the top of portion 22 and the cover 28.

The player 20 also includes an opening 32 which is provided so that a caddy enclosing a record may be inserted into the player to load a record. When the record is loaded and the function lever 34 is moved from the load position to the play position, a door (not shown) inside of the player is moved to close off the opening 32. It is desirable to provide some special apparatus over and above the door in the area of opening 32 for purposes of RF shielding.

The benefits and advantages of the present invention will be discussed in connection with the seams 26 and 30 shown in FIG. 1. Again, one benefit of the present invention is the ability to provide a plurality of substantially short circuits at a given frequency, e.g. 915 MHz, around seams 26 and 30 without direct physical contact being made between the two conductive surfaces of interest. In actual practice of the invention, the short circuits, or, at least low impedance paths, are effective over a band of frequencies centered about 915 MHz.

Figure 2:
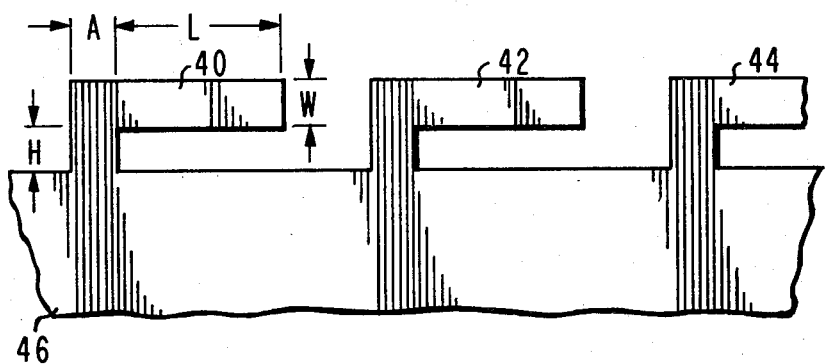
FIGS. 2–4 are examples of stubs which may be used in the practice of the present invention.
Figure 3:
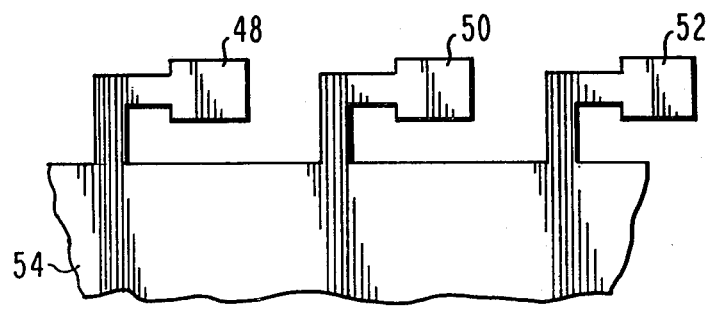
Figure 4:
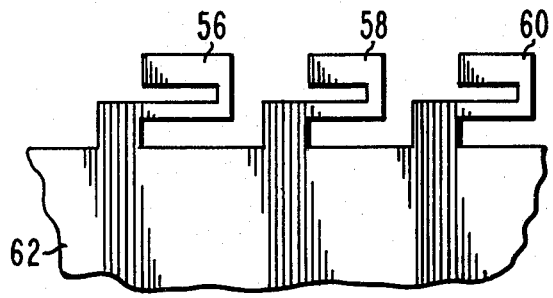

FIGS. 2–4 show a variety of stub configurations which may be used in the practice of the present invention. In FIG. 2, a series of stubs 40, 42, 44 are shown. Each stub is made from a thin copper conductor and the dimensions of A, H and W are each one-eighth of an inch and dimension L is two inches. One end of each of the stub elements is connected to a common conductive member 46, while the other end of each stub is open circuited. Consider now another conductive surface lying in a plane parallel to the conductive member 46 and stubs 40, 42 and 44. Further consider a dielectric such as polystyrene about one-eighth of an inch thick separating the structure of FIG. 2 from the parallel conductive surface. Such a composite structure may be thought of as a plurality of microstrip lines with the other conductive surface forming the ground plane. If the length L is selected such that it is approximately a quarter wavelength at 915 MHz taking into consideration the dielectric constant of the separator, then the open circuit at the far end of each stub will be transformed or reflected back at the near end as a short circuit between the stub and the other conductive surface at the frequency of interest and indeed will be a low impedance path across a band of frequencies such as 900–930 MHz.

Thus, the structure of FIG. 2 when combined with a ground plane and dielectric separator will form a plurality of low impedance paths between the near end of the stub and the ground plane in the frequency band of interest.

FIG. 3 shows another configuration for the stubs wherein the stub path dimensions are changed. This makes it possible to reduce the stub distance so that a greater number of stubs may be used in connection with a given seam between two conductive surfaces. The stubs 48, 50 and 52 comprise first portions extending from the common conductive member 54, a second portion extending at a right angle from the first portion and a third portion of a greater width than the second portion extending from the second portion and terminating in an open circuit.

FIG. 4 shows stubs 56, 58 and 60 where not only the stub path dimensions are changed but the stub is folded back on itself. This technique permits even greater numbers of stubs to be used without touching one another and without introducing adverse interactions while still providing the desired low impedance paths. Stubs 56, 58 and 60 comprise a first portion extending from common conductive member 62, a second portion at a right angle relative to the first portion, a third portion parallel to the second portion and a fourth portion connecting the second and third portions.

In FIGS. 2–4 the vertical portions of the stubs extending from the common conductors 46, 54 and 62 provide some inductive loading. In actual practice it may be desirable to shorten the length of the stub to slightly less than a quarter wavelength at the frequency of interest so that the stubs are slightly capacitive to balance out the inductive loading.

It will now be evident that many modifications of the various stub parameters and the configuration as a whole may be made while practicing the present invention.

Figure 5:
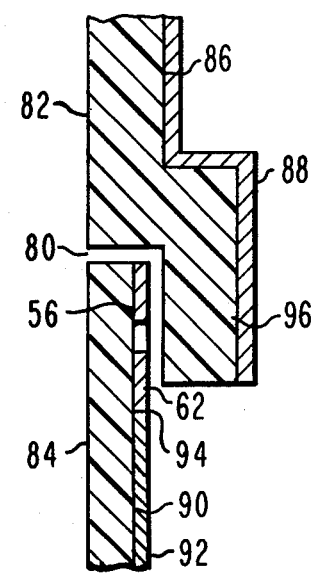
FIG. 5 is a sketch showing the use of the present invention at the interface area of two conductive surfaces of the player of FIG. 1.

Turning now to FIG. 5, a section of an interface area 80 is shown. This area can be a portion of the seam 26 or the seam 30 in FIG. 1. Assume that area 80 is a portion of seam 26. Surface 82 is then representative of the outer surface of the upper portion 22 of the player 20. Surface 84 is representative of the outer surface of the lower portion 24 of the player 20. The upper and lower portions are molded from a material such as polystyrene. The inner surface 86 of the upper portion is coated with a metalized conductive paint to form a conductive surface 88 which extends down to the lower end of the upper portion. Similarly, the inner surface 90 of the lower portion is coated with a metalized conductive paint to form conductive surface 92. It is desired to generate low impedance paths between surface 88 and surface 92 without making a direct physical contact between the conductive surfaces.

To accomplish the desired goal, the arrangement of FIG. 4 (for example) is placed on the inner surface 90 of the lower portion near the interface area. It will be understood that there are a plurality of stubs such as 56 going all the way around the seam 26. The common conductive member 62 is electrically connected at 94 to the conductive surface 92. This connection may be a direct physical connection or an electrical low impedance in the frequency band of interest. That is, the microstrip technique described above can be used to form a low impedance connection between member 62 and surface 92.

The overlap extension 96 of the upper portion provides the dielectric (polystyrene) separator between the stub elements such as 56 and the conductive surface 88. Extension 96 provides a spaced parallel relationship between the plurality of stubs like 56 and the conductive surface 88. The surface 88 acts as the ground plane which taken with the stubs such as 56 creates a plurality of microstrip lines. Each microstrip line transforms the open circuit at one end to a low impedance path in the vicinity of the common conductive member 62. The common conductive member 62 is electrically connected to the conductive surface 92. Thus the arrangement of FIG. 5 provides a plurality of low impedance paths between surface 88, and surface 92 without any direct electrical connection therebetween. This arrangement effectively seals off the interface area 80 in the seam 26 to reduce the radiation of RF energy in the frequency band of interest from the interface area. By reciprocity, the arrangement reduces the possibility of outside RF energy in the band of interest from entering the player 20 through the seam 26.

Figure 7:
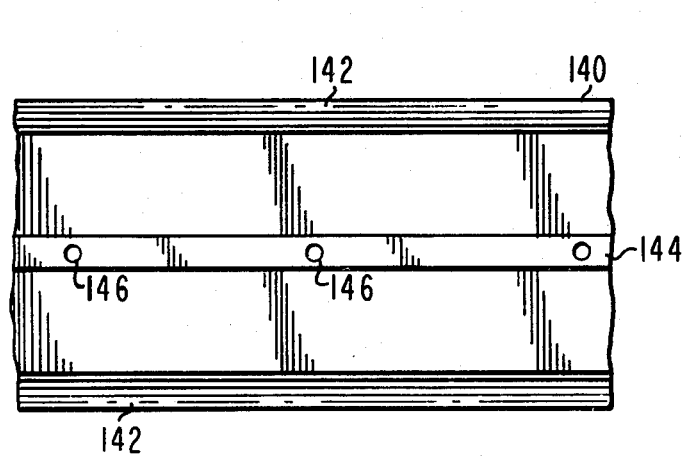
Figure 8:
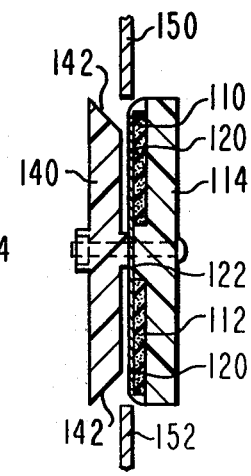

As previously mentioned, in some applications it may be desired to use a conductive box inside of the decorative shell of player 20. In this case it has been found that a preferred method of practicing the present invention is the gasket as shown in FIGS. 6-8.

Figure 6:
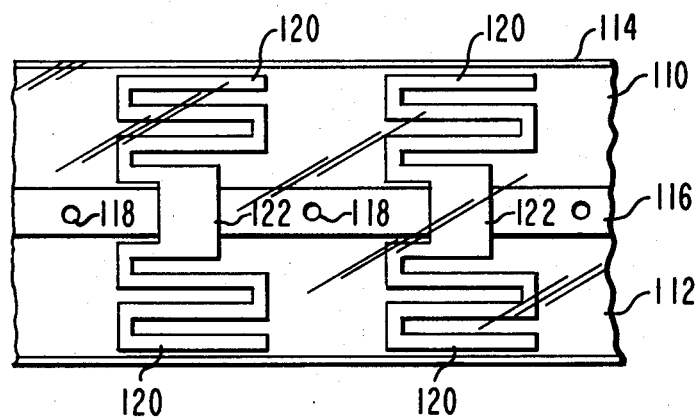
FIGS. 6–8 are sketches of another embodiment of the present invention.

In FIG. 6, neoprene strips 110 and 112 are placed along the bottom half of a gasket housing 114. The gasket housing bottom includes a raised step 116 having through holes 118 periodically positioned along the length of the step 116. An elongated strip of one mil Mylar (polyethylene terephthalate) having a plurality of stub pairs 120 connected by common conductive members 122 is positioned over the housing bottom 114. In this configuration, the stubs 120 and common connectors 122 are formed from one-half ounce copper and may be formed through known etching techniques. The common conductor members 122 are about 0.25 inch wide. The folded back stubs are 0.010 inch wide and occupy an area 0.375 inch wide and 0.090 inch above the members 122. The stub to stub spacing of the upper stubs is 0.75 inch from center to center. The copper side touches the neoprene and the Mylar is facing up.

In other arrangements common conductive member 122 can be a continuous strip as shown in FIGS. 2-4 if desired from a mechanical construction point of view.

Note in this configuration there is a first plurality of stubs (upper ones) and a second plurality of stubs (lower ones). The upper stubs will form low impedance paths to one portion of a conductive member of the enclosed conductive box, say the upper half of the box and the lower stubs will form a low impedance path to another portion of a conductive member of the enclosed conductive box, say the lower half of the box. The common conductive members 122 form the low impedance path between the upper stubs and the lower stubs. By separating the stub pairs (upper and lower) as shown, it is possible to locate the holes 118 as shown for mechanical purposes.

FIG. 7 shows the top half of the gasket housing 140. It is made from a plastic material and includes tapers 142, a step 144 and through holes 146 corresponding to holes 118 in the bottom half.

FIG. 8 shows the two halves of the RF gasket assembled. Fasteners are placed through the corresponding holes to form an elongated gasket strip. The gasket strip is then placed along the seam by inserting the upper portion of the conductive box, represented by 150, into the upper part of the gasket. The lower portion of the conductive box, represented by 152, is inserted in the lower part of the gasket.

The Mylar strip has the copper side facing the neoprene 110 and the Mylar strip can be secured to the neoprene and bottom half of the gasket using an adhesive. The Mylar strip is brought around the edges of the bottom half of the gasket and may be secured on the sides or back of the gasket with an adhesive.

The neoprene is used so that its resiliency will take up any tolerance variations and thus press the Mylar side of the strip against the inserted conductor such as 150.

The theory of operation is that radiation will normally be supported along the elongated dimension of seams. By using the gasket as shown in FIG. 8, the effect is the same as placing a plurality of short circuits between the upper part 150 and the lower part 152. This in turn has the effect of breaking up the seam into a plurality of short sections bounded by low impedance paths. The short sections do not readily support the propagation of energy in the frequency range of interest.

The general technique described above for breaking up elongated seams into short sections can also be used for the caddy door of FIG. 1 with a straight edged enclosed conductive box as described above. In this case, the upper plurality of stubs works with an upper portion of the enclosed conductive box to form microstrip lines in accordance with the present invention. The lower plurality of stubs works with a lower portion of the enclosed conductive box in the caddy door region to form a second plurality of microstrip lines. The stub pairs are joined by common conductive members as shown in FIG. 6. The stub pairs and the respective common conductors are positioned on the caddy door itself. Thus, in this case, the common conductors are longer in the top to bottom dimension. Again, the net effect is to place a plurality of low impedance paths from the top of the caddy door opening to the bottom and these paths break up the elongated dimension of the caddy door opening (when the caddy door is in the closed position during record playback) into a plurality of short sections which will substantially reduce the ability of the caddy door opening to support the propagation of energy in the frequency band of interest.

Now it will be readily understood that the principles of the present invention should be useful in many different types of equipment where there is concern about RF leakage or susceptibility in a band of frequencies.

What is claimed is:

1. In combination:
 a first conductive surface for providing electrical shielding;
 a second conductive surface for providing electrical shielding, said second surface having at least a portion thereof contiguous with at least a portion of said first conductive surface but not in direct electrical contact therewith, thereby creating an interface area, said interface area allowing the flow of energy therethrough in a given frequency band whereby said shielding is rendered less effective;
 a plurality of elongated conductive stub-like members positioned in said interface area, a first end of each of said stub-like members being directly connected to a common conductive member and each of said stub-like members being spaced at a given distance from at least a portion of said first conductive surface such that said stub-like members and said first conductive surface form a plurality of microstrip lines open-circuited at the second end of each stub-like member remote from said first end;
 each of said stub-like members being dimensioned such that said open circuits at said second ends are transformed into low impedance paths in said given frequency band, said paths effectively occurring between said portion of said first conductive surface and respective points in the vicinity of said first ends of said stub-like members without direct conductive contact between said first conductive surface and said respective points in the vicinity of said first ends of said stub-like members; and
 means adapted for coupling said common conductive member to said second conductive surface.

2. The apparatus according to claim 1 wherein each of said plurality of stub-like members comprises a first conductive section extending from said common conductive member and at least a second conductive section extending perpendicularly from said first section.

3. The apparatus according to claim 1 wherein each of said plurality of stub-like members has a total length from one end to the other end which is substantially a quarter wavelength long at a frequency in said given band.

4. The apparatus according to claim 1 wherein said two conductive surfaces comprise inner surfaces of a box-like device and said interface area comprises a seam separating said inner surfaces.

5. Apparatus for reducing the propagation of energy through an interface area between two conductive surfaces, said apparatus comprising:
a first plurality of conductive stub-like members adapted for being positioned in proximity to one conductive surface;
a second plurality of conductive stub-like members adapted for being positioned in proximity to said second conductive surface;
connecting means for electrically and mechanically connecting at least one stub-like member of said first plurality to at least one stub-like member of said second plurality, said first and second plurality of stub-like members and said connecting means being formed on an elongated strip of dielectric material;
said first plurality of stub-like members forming a plurality of low impedance paths in a given frequency range between said connecting means and one of said conductive surfaces when positioned in proximity to said one conductive surface;
said second plurality of stub-like members forming a second plurality of low impedance paths in said given frequency range between said connecting means and the other of said conductive surfaces when positioned in proximity to said other conductive surface.

6. The apparatus according to claim 5 wherein said first and second plurality of stub-like members and said connecting means are formed from copper and said dielectric strip is formed from Mylar.

* * * * *